United States Patent [19]
Sakai et al.

[11] Patent Number: 5,766,386
[45] Date of Patent: Jun. 16, 1998

[54] METHOD OF PRODUCING METAL CLAD LAMINATE

[75] Inventors: Hiroshi Sakai; Yoshihiro Nakamura; Hikari Murai, all of Shimodate; Toshiyuki Iijima, Oyama, all of Japan

[73] Assignee: Hitachi Chemical Company, Ltd., Tokyo, Japan

[21] Appl. No.: 709,446

[22] Filed: Sep. 6, 1996

[30] Foreign Application Priority Data

Sep. 7, 1995 [JP] Japan .................................. 7-229747

[51] Int. Cl.⁶ .......................... B32B 31/20; D21H 13/40
[52] U.S. Cl. ...................... 156/62.2; 156/283; 156/327; 156/329; 156/330.9; 162/128; 162/138; 162/145; 162/156
[58] Field of Search ...................... 156/62.2, 283, 156/327, 329, 330.9; 162/125, 128, 138, 145, 152, 156, 181.9; 428/901

[56] References Cited

U.S. PATENT DOCUMENTS 4,876,120  10/1989  Belke et al. .
5,037,691   8/1991  Medney et al. .
5,103,293   4/1992  Bonafino et al. .

FOREIGN PATENT DOCUMENTS 2160998  6/1990  Japan .

*Primary Examiner*—Michael W. Ball
*Assistant Examiner*—Sam Chuan Yao
*Attorney, Agent, or Firm*—Antonelli, Terry, Stout & Kraus, LLP

[57] ABSTRACT

A metal clad laminate which is thin and flat and has high resistivity to metal migration and excellent drilling processability is produced by bonding at least two layers of resin sheets and a metal foil layered on at least one side of the layered resin sheets with heat and pressure, each of the resin sheets comprising inorganic fibers, solid particles of a thermosetting resin and a cured binder resin bonding the inorganic fibers and the solid particles of the thermosetting resin together.

11 Claims, No Drawings

METHOD OF PRODUCING METAL CLAD LAMINATE

BACKGROUND OF THE INVENTION (a) Field of the Invention

The present invention relates to a method of producing metal clad laminates useful as insulating and wiring materials in the production of printed wiring boards or the like.

(b) Description of the Related Art

Printed wiring boards used in computers and electronic and electric equipments comprise conductors and insulators.

The insulators which have been mainly used are laminates which are produced by impregnating insulating fiber base materials with thermosetting resin varnishes, heating the impregnated fiber base materials to cure the thermosetting resin to B-stage to obtain prepregs, layering the prepregs, and then heating and pressing the layered prepregs. The fiber materials which have been generally used are woven or non-woven fabrics including paper.

Conductors are provided on the laminates by heating and pressing the prepregs with metal foil put thereon to form metal clad laminates, and then removing needless parts from the metal foil on the surfaces of the metal clad laminates.

As the electronic and electric equipments are downsized, printed wiring boards require thinner insulators and narrower and closer wiring tracks. To produce thin laminates, thin fiber base materials are used. Among known glass fabrics for electric insulation, the thinnest one is a glass fabric (MIL No. 104) of 25 µm in nominal thickness.

When impregnated with resin varnishes, such a very thin glass fabric of 25 µm in nominal thickness, however, requires sufficient tension control, or the glass fabric will be easily bent or torn, and the productivity will be reduced severely. Further, such a glass fabric is expensive since it is produced by using difficult weaving techniques such that the products include many inferior goods.

Metal migration, which increases as the distance between conductors decreases and is predominated by CAFs (Conductive Anodic Filaments) which grow along glass filaments. So long as glass fabric laminates are used, this phenomenon cannot be avoided completely.

As the density of printed wiring boards has been increased, the insulator layers have been made thinner, and wiring patterns have been made finer by reducing the width of conductors and the distances therebetween. In subtractive processes for forming circuit patterns in printed wiring boards, adhesion of etching resist is an essential factor of fine patterning, and as the wiring patterns are made finer, etching failures due to poor adhesion of the etching resist increase. A cause for the poor adhesion of etching resist is the windings on glass fabric surfaces. Windings peculiar to textile are inevitable accompaniment to glass woven fabrics, and the windings on the surfaces of glass woven fabrics also appear on the surfaces of laminates produced by using the glass woven fabrics. The windings on the surfaces of laminates make the adhesion of etching resist partially insufficient, causing etching failures, such as disconnection of circuit patterns.

With the increase in the density of printed wiring boards, the distance between through holes have been also decreased, to raise another problem of a decrease in the insulation reliability between through holes. This is related to the roughness of the wall surfaces in through holes, and there is a demand for improved drilling processability on laminates which are used for the production of printed wiring boards. Rough wall surfaces in through holes allow etchant to permeate into insulators and to deteriorate the insulation reliability.

CAFs can be decreased by using non-woven fabrics as fibrous base materials since non-woven fabrics contain no continuous, long fibers. Further, due to the absence of bundles of fibers, the stress set up by drilling is distributed, and the drilling processability is improved. Also the absence of the windings peculiar to woven fabrics gives laminates with even, flat surfaces.

Non-woven fabrics, particularly glass non-woven fabrics, however, need some thickness to produce prepregs by impregnation with thermosetting resin varnish. That is, in laminates produced by using non-woven fabrics, the problems of metal migration and drilling processability are dissolved to some degree, but it is difficult to produce thinner laminates.

SUMMARY OF THE INVENTION

The object of the present invention is to provide a method of producing a metal clad laminate which is thin, has very flat surfaces, high resistivity to metal migration and excellent drilling processability, and, therefore, is useful for the production of high density printed wiring boards.

That is, the present invention provides a method of producing a metal clad laminate comprising bonding at least two layers of resin sheets and a metal foil layered on at least one side of the layered resin sheets with heat and pressure, each of the resin sheets comprising inorganic fibers, solid particles of a thermosetting resin and a cured binder resin fixing the inorganic fibers and the solid particles of the thermosetting resin together.

DESCRIPTION OF THE PREFERRED EMBODIMENTS

In the above-described conventional method wherein thermosetting resins are added into inorganic fiber base materials by impregnation of varnishes, the inorganic fiber materials need a certain thickness. On the other hand, according to the present invention, a large amount of thermosetting resins can be blended into a small amount of inorganic fibers since the cured binder resin fixes the inorganic fibers and the particles of the thermosetting resin together, the inorganic fibers together, and the solid particles of the thermosetting resin together.

The inorganic fibers may be, for example, ceramic fibers, glass fibers or mineral wool. Some examples of the ceramic fibers include magnesia fiber, boron carbide fiber, silicon carbide fiber, silica fiber, boron fiber, boron nitride fiber, alumina fiber, tungsten carbide fiber, titanium carbide fiber and zirconium oxide fiber. Some examples of the mineral wool include asbestos, chrysotile, anthophylite, tremolite and antinolite. The inorganic fibers may be either long fibers or short fibers, so long as the fibers can construct a sheet structure, and are preferably 1 to 20 µm, more preferably 1 to 10 µm in diameter.

The solid particles of the thermosetting resin in the resin sheets are not yet cured, and will be softened, melted and cured by the heating and pressing for bonding the layered composite comprising the resin sheets and the metal foil.

The method of producing the resin sheets is not limited, and paper making techniques are suitably applicable for easily and efficiently producing thin resin sheets. For example, a preferred method comprises removing water from a slurry comprising the inorganic fibers, the solid particles of the thermosetting resin and the water to form a sheet comprising the inorganic fibers and the solid particles of the thermosetting resin, coating the sheet with a curable binder resin, and then heating the sheet to dry and cure the curable binder resin but not to cure the solid particles of the thermosetting resin.

The solid particles of the thermosetting resin are not particularly limited so long as the solid particles maintain the solid state until the heating and pressing stage for producing the metal clad laminate and are water-insoluble. Suitable thermosetting resins are, for example, epoxy resins, thermosetting polyimide resins and cyanate resins. These thermosetting resins may contain curing agents and cure accelerators.

The epoxy resins which are suitable for the present invention are solid at room temperature (generally 15° to 35° C.) and insoluble in water, and, for example, comprise at least one resin ingredient selected from the group consisting of a bisphenol A epoxy resin, a bisphenol F epoxy resin, a bisphenol S epoxy resin, a phenol novolac epoxy resin, a cresol novolac epoxy resin, an alicyclic epoxy resin, a glycidyl ester epoxy resin, a glycidylamine epoxy resin, a hydantoin epoxy resin, an isocyanurate epoxy resin, a linear high molecular weight epoxy resin, a phenoxy resin, those of halogenated structures and those of hydrogenated structures, and at least one curing agent. The curing agents for these epoxy resins are, for example, difunctional phenols, such as bisphenol A, bisphenol S, bisphenol F, catechol and resorcinol, novolac phenolic resins, such as a bisphenol A novolac resin, a cresol novolac resin and a phenol novolac resin, aliphatic polyamines, such as ethylene diamine, diethylene triamine, triethylene tetramine, tetraethyl pentamine, dipropylene diamine, diethylaminopropylamine, hexamethylene diamine, isophorone diamine, bis(4-amino-3-methyldicyclohexyl)methane, diaminodicyclohexylmethane, bis(aminomethyl) cyclohexane, N-aminoethylpiperazine and 3,9-bis(3-aminopropyl)-2,4,8,10-tetraoxapyro(5,5)undecane, aromatic polyamines, such as m-xylylene diamine, m-phenylene diamine, diaminodiphenylmethane, diaminodiphenyl sulfone and diaminodiethyldiphenylmethane, acid anhydrides, such as dodecenylsuccinic anhydride, tetrahydrophthalic anhydride, hexahydrophthalic anhydride, chlorendic anhydride, ethylene glycol anhydrous trimellitic ester, methyltetrahydrophthalic anhydride and methylhexahydrophthalic anhydride, dicyandiamide and derivatives thereof, methylol-containing compounds, such as a urea resin and a melamine resin, and polyisocyanates. These epoxy resins may contain cure accelerators, such as imidazole compounds, organic phosphoric compounds, tertiary amines, quaternary ammonium salts and masked imidazole compounds whose secondary amino groups are masked by acrylonitrile, isocyanates, melamine or acrylates. The imidazole compounds are, for example, imidazole, 2-methylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-ethyl-4-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline and 2-phenyl-4-methylimidazoline, and the masking agents for these imidazoles are, for example, acrylonitrile, phenylene diisocyanate, toluene diisocyanate, naphthalene diisocyanate, hexamethylene diisocyanate, methylenebisphenyl isocyanate and melamine acrylate. These resin ingredients preferably have a weight average molecular weight of 100 to 50,000, more preferably 500 to 15,000.

The thermosetting polyimide resins which are suitable for the present invention are solid at room temperature and insoluble in water, and, for example, comprise at least one resin ingredient selected from the group consisting of an addition-type polyimide resin, such as a bismaleimide resin, a nadic acid-terminated polyimide resin and an acetylene-terminated polyimide resin, and at least one curing agent. The bismaleimide resins suitable for the present invention are, for example, KERIMIDE and KINEL (trade names, produced by Rhone-Poulenc S. A.), and the nadic acid-terminated polyimides suitable for the present invention are, for example, PMR-15, PMR-11, PMR-NV and LARC-160 (trade names, developed by NASA), and the acetylene-terminated polyimide resins suitable for the present invention are, for example, THERMID 600 and THERMID IP-600 (trade names, produced by Gulf Oil Co., Ltd.). These resin ingredients are preferably prepolymers having a weight average molecular weight of 100 to 10,000, more preferably 500 to 1,500. The curing agents useful for the thermosetting polyimide resins are, for example, 4,4'-diaminodiphenylmethane and benzoguanamine.

The cyanate resins which are suitable for the present invention are solid at room temperature and insoluble in water, and, for example, comprise at least one prepolymer of a cyanate compound having two or more cyanate groups per molecule, such as bis(4-cyanatephenyl)ethane, bis(3,5-dimethyl-4-cyanatephenyl)methane, 2,2-bis(4-cyanatephenyl)-1,1,1,3,3,3-hexafluoropropane and α,α'-bis (4-cyanatephenyl)-m-diisopropylbenzene. These prepolymers preferably have a weight average molecular weight of 100 to 10,000, more preferably 500 to 1,500. These cyanate resins may contain cure accelerators, for example, organic metal salts of cobalt, manganese, tin, nickel, zinc and copper, such as cobalt 2-ethylhexanoate and cobalt naphthenate. To these cyanate resins, epoxy resins and polyhydric phenols may be added to improve heat resistance, and flame retardants to improve non-flammability.

The content of the curing agents in the solid particles of the thermosetting resin is generally 5 to 60% by weight, preferably 10 to 40% by weight. The content of the cure accelerators, if any, in the solid particles of the thermosetting resin is generally 0.01 to 5% by weight, preferably 0.1 to 1% by weight.

To prevent the solid particles of the thermosetting resin from curing during the drying step of the production of the resin sheets, the solid particles of the thermosetting resin preferably have a gel time of more than five minutes at 130° C.

The particle sizes of the solid particles of the thermosetting resin are preferably 0.001 to 100 μm, more preferably 0.1 to 10 μm.

The cured binder resin in the resin sheets is not particularly limited so long as it can fix the inorganic fibers and the solid particles of the thermosetting resin together. The preferred examples of the cured binder resin are, for example, a cured acrylic resin, a cured phenol-poly (vinylacetal) resin, a cured phenolic nitrile rubber, a phenolic chloroprene resin and a cured silicone resin. The cured binder resin in the resin sheets is not necessarily cured to C-stage completely, and may be semicured to B-stage so that the inorganic fibers and the solid particles of the thermosetting resin are securely fixed together to maintain the sheet form of the resin sheets and the resin sheets are not sticky and are easy to handle. Such a binder resin which is semicured to B-stage will be cured to C-stage by the heating and pressing for producing the metal clad laminate.

In the method of producing the resin sheets using the above-described paper forming techniques, first a slurry comprising the inorganic fibers, the solid particles of the thermosetting resin and water is prepared. The solids concentration in the slurry varies depending on the desired thickness of the resin sheets or the like, and is generally 0.01 to 10% by weight, preferably 0.1 to 1% by weight.

Water is then removed from the slurry to form a sheet comprising the inorganic fibers and the solid particles of the thermosetting resin. The removal of water may be performed by any method which is suitable for forming sheets of a uniform thickness. For example, the slurry is discharged from a tank onto a metal net to remove water, and the residual water is then removed in a suction box. The metal net is generally of 10 to 200 mesh. The basis weights of the sheet and the resin sheet can be controlled by varying the amount of the discharged slurry.

The resulting sheet is then coated with a curable binder resin which is the raw material of the cured binder resin in the resin sheets. Preferable curable binder resins are thermosetting resins which can be semicured or cured to B-stage or C-stage by the heating for drying the coated sheet but do not affect the solid particles of the thermosetting resin or the curing thereof. Such thermosetting resins are, for example, a thermosetting acrylic resin, a phenolic resin/poly (vinylacetal) resin adhesive, a phenolic resin/nitrile rubber adhesive, a phenolic resin/chloroprene resin adhesive and a thermosetting silicone resin. Self curing resins, which can be cured at room temperature without heating, may also be used.

The thermosetting acrylic resins generally comprise at least one copolymer of an acrylate, such as ethyl acrylate, ethyl methacrylate, butyl acrylate, butyl methacrylate, with various monomers which introduce into main chains or side chains of the thermosetting acrylic resins at least two functional groups, and at least one curing agent. The functional groups are, for example, carboxylic groups or anhydride thereof, epoxy groups, amino groups, hydroxyl groups and polymerizable functional groups. These thermosetting acrylic resins may contain no curing agents depending on the functional groups.

The monomers for introducing carboxylic groups or anhydride thereof are, for example, acrylic acid, methacrylic acid, itaconic acid and maleic anhydride. The curing agents for the copolymers having carboxylic groups or anhydride thereof are, for example, melamine resins, epoxy resins, metal oxides, methylol compounds which are reaction products of urea, melamine or benzoguanamine with formaldehyde, isocyanates, phenolic resins or glycols.

The monomer for introducing epoxy groups is, for example, glycidyl methacrylate. The curing agents for the copolymers having epoxy groups are, for example, compounds or polymers which have, per molecule, at least two functional groups, such as amino groups, carboxyl groups, amido groups, N-methylol groups or N-methylolalkylether groups.

The monomers for introducing hydroxyl groups are, for example, β-hydroxyethyl acrylate, β-hydroxyethyl methacrylate, β-hydroxypropyl methacrylate and β-hydroxyethyl vinyl ether. The curing agent for the copolymers having hydroxyl groups is, for example, trimethylpropane-1-methyl-2-isocyano-4-carbamate. The copolymers having hydroxyl groups may also be cured by heating in the absence of curing agents, or may be self-cured in the presence of catalysts, such as ammonium chloride or ammonium secondary phosphate.

The monomers for introducing amino groups are, for example, acrylamide, methacrylamide, ureidoethyl acrylate, ureidoethyl vinyl ether and methacryloyldicyandiamide. The curing agent for the copolymers having amino groups is, for example, formaldehyde.

The monomer for introducing polymerizable functional groups is, for example, β-vinyloxyethyl methacrylate. Only one vinyl group of β-vinyloxyethyl methacrylate is polymerized to form a linear polymer, which can be cured by polymerizing the remaining vinyl group in the presence of radical catalysts.

These copolymers preferably have a weight average molecular weight of 1000 to 200,000, more preferably 5,000 to 100,000, and may contain other copolymer units, such as acrylonitrile units, styrene units and butadiene units.

The phenolic resin/poly(vinylacetal) resin adhesive comprises a mixture of a poly(vinylacetal)resin and a phenolic resin in a weight ratio of about 10:3 to 10:20. The poly (vinylacetal)resin preferably has a weight average molecular weight of 50,000 to 300,000, more preferably 100,000 to 300,000, and the phenolic resin preferably has a weight average molecular weight of 100 to 1,000, more preferably 200 to 800.

The phenolic resin/nitrile rubber adhesive comprises a nitrile rubber and a phenolic resin. The phenolic resin preferably has a weight average molecular weight of 100 to 1,000, more preferably 200 to 800, and the nitrile rubber preferably has a weight average molecular weight of 10,000 to 1,000,000, more preferably 100,000 to 300,000.

The phenolic resin/chloroprene resin adhesive is prepared by mixing a chloroprene rubber and a phenolic resin which has been pre-reacted with MgO. The phenolic resin preferably has a weight average molecular weight of 100 to 1,000, more preferably 200 to 800, and the chloroprene rubber preferably has a weight average molecular weight of 10,000 to 1,000,000, more preferably 100,000 to 300,000.

The thermosetting silicone resins which are suitable for the present invention, for example, comprise at least one vinyl group-containing silane compound selected from the group consisting of α-methacryloxypropyltrimethoxysilane, vinyltrichlorosilane, vinyltrimethoxysilane, vinyltriethoxysilane, vinyltris(β-methoxyethoxy)silane and vinyltris(t-butylperoxide)silane, and, as a curing agent, a hydrogen-silicon bonds-containing polysiloxane. The hydrogen-silicone bonds-containing polysiloxane preferably has a weight average molecular weight of 10,000 to 1,000,000, more preferably 50,000 to 500,000.

These curable binder resins may be used individually or as a mixture of two or more. Inorganic binders may be added to these curable binder resins.

The content of the curing agents, if any, in these curable binder resins is generally 1 to 30% by weight, preferably 10 to 20% by weight.

It is necessary that these curable binder resins can be cured to B-stage or C-stage under such heating conditions that the solid particles of the thermosetting resin are not cured. Therefore, these curable binder resins preferably have a gel time of 5 to 300 seconds at 130° C.

The method of coating the sheet with the curable binder resin may be selected from any conventional methods, such as spraying, impregnation and dipping.

The sheet coated with the curable binder resin is then dried by heating under such conditions that the curable binder resin can be cured but the solid particles of the thermosetting resin are not cured, to obtain the resin sheet used in the present invention. The drying by heating is generally carried out at 100° to 180° C., preferably 100° to 140° C., for 5 to 300 seconds, preferably 10 to 90 seconds.

The resin sheet preferably contains the inorganic fibers and the solid particles of the thermosetting resin in a weight ratio of (inorganic fibers):(solid particles of thermosetting resin) of 50:50 to 10:90, more preferably 40:60 to 20:80. If the ratio isn't within the range of 50:50 to 10:90, the lamination may become insufficient.

The amount of the cured binder resin in the resin sheet is preferably 1 to 20% by weight, more preferably 5 to 10% by weight, based on the total of the inorganic fibers and the solid particles of the thermosetting resin. If the amount of the cured binder resin isn't within the range of 1 to 20% by weight, the strength of the resin sheet may be insufficient, and it may become difficult to form the resin sheet.

The resin sheet, according to demands, may further contain additives, such as inorganic fillers, thermoplastic resins, colorants, antioxidants, ultraviolet absorbers, reducers, fire retardants and plasticizers. These additives may be added to the resin sheet by adding them into the slurry used for the production of the resin sheet or into the curable binder resin or into the solid particles of the thermosetting resin.

A desired number of the resin sheets are put in layers with a metal foil layered on at least one side of the layered resin sheets, and the layered composite is bonded with heat and pressure to produce a metal clad laminate.

The metal foil may be selected from any ones which are commonly used in the production of metal clad laminates, for example, copper foil of 5 to 150 μm in thickness and aluminum foil of 0.01 to 4 mm in thickness.

The bonding is generally carried out at 160° to 200 ° C., preferably 170° to 190° C., for 60 to 180 minutes, preferably 80 to 120 minutes, at 0.5 to 15 MPa, preferably 2 to 10 MPa.

EXAMPLE 1 AND COMPARATIVE EXAMPLES 1 AND 2

EXAMPLE 1

Thin glass fibers of 1.8 μm in mean fiber diameter and 1 mm in mean length and glass chopped strands of 10 mm in length are dispersed in water in equal weights to give a 0.4 % by weight slurry. The glass chopped strands are strands of glass fibers of 9 μm in fiber diameter bundled with a water-soluble binder and can be taken apart into fibers when dispersed in water. 100 parts by weight of a brominated bisphenol A epoxy resin (trade name: EPIKOTE E5048, produced by Yuka Shell Epoxy Co., Ltd., bromine content: 25% by weight, epoxy equivalent weight: 670 g/eq, Mw: 1,800), 15 parts by weight of a phenolic novolac resin (trade name: BARCAM TD-2131, produced by Dainippon Ink & Chemicals, Inc., softening point: 80° C., phenolic hydroxyl equivalent weight: 103 g/eq, Mw: 700) and 0.15 parts by weight of 2-phenylimidazole (trade name: CUREZOL 2PZ, produced by Shikoku Chemicals Corp.) were mixed by using a 8-inch roll machine (roll temperature: 90° C.), and the mixture was then cooled and ground to form solid epoxy resin particles of 8 μm in mean particle size. The solid epoxy resin particles had a gel time of more than 10 minutes at 130° C., and 200 seconds at 160° C. The solid epoxy resin particles were mixed into the slurry so that the weight ratio of the inorganic fibers:solid epoxy resin particles was 30:70.

The resulting slurry containing the inorganic fibers and the solid epoxy resin particles was discharged from a tank onto a metal net of 80 mesh to remove water and to form a sheet having a basis weight of 73 g/m$^2$ in a dried state, and the residual water was then removed in a suction box.

A thermosetting acrylic resin solution prepared as follows was added to the sheet by spraying, and the sheet was then heated to 120° C. for 40 seconds to obtain a resin sheet containing 25% by weight of a cured acrylic resin.

Eight sheets of the resin sheets were put in layers with a copper foil of 18 μm in thickness layered on each side of the layered resin sheets, and were then heated and pressed at 170° C. for 90 minutes under a pressure of 3 MPa, to obtain a double-sided copper-clad laminate.

In the obtained laminate, the thickness per fiber base material was 40 μm. The surface roughness of the laminate was measured to be 3.3 μm in maximum roughness (Rmax), 2.2 μm in mean roughness (Rtm) and 3.6 μm in maximum wave crest (WCM).

Synthesis of the thermosetting acrylic resin

Into 1-litter flask equipped with a thermometer, stirring blades, a dropping funnel and a condenser were introduced 88.5 parts by weight of butyl acrylate, 6.5 parts by weight of acrylonitrile and 5 parts by weight of hydroxyethyl methacrylate, and MEK was then added thereto so that the total of the monomers was 40% by weight in the resulting mixture. After the mixture was heated to 60° C., 100 ml of a MEK solution containing 0.5% by weight of AIBN was added dropwise over a one hour interval with stirring, and reaction was carried out at a reflux temperature for 5 hours. After addition of 100 ml of a MEK solution containing 2% by weight of AIBN, the mixture was further heated at a reflux temperature for 30 minutes. After the reaction mixture was cooled, 10 parts by weight of trimethylpropane-1-methyl-2-isocyano-4-carbamate (trade name: CORONATE L, produced by Nippon Polyurethane Kabushiki Kaisha) as a curing agent was added per 100 parts by weight of the solid contents, to obtain a thermosetting acrylic resin solution.

The acrylic resin (without the curing agent) had a Tg of −44° C., a weight average molecular weight of 700,000, a hydroxyl content of $3.8 \times 10^{-4}$ mole/g. The thermosetting acrylic resin containing the curing agent had a gel time of 90 seconds at 120° C., and 50 seconds at 130° C.

COMPARATIVE EXAMPLE 1

A varnish was prepared by dissolving 100 parts by weight of an brominated bisphenol A epoxy resin (trade name: EPIKOTE E5048, produced by Yuka Shell Epoxy Co., Ltd.), 15 parts by weight of a phenol novolac resin (trade name: BARCAM TD-2131, produced by Dainippon Ink & Chemicals, Inc.) and 0.15 parts by weight of phenylimidazole in a solvent mixture of ethylene glycol monomethyl ether/methyl ethyl ketone (weight ratio: 1/100). A glass woven fabric of 25 μm in thickness (MIL No. 104) was impregnated with the varnish, and was then dried to obtain prepregs. Eight sheets of the prepregs were put in layers with a copper foil of 18 μm in thickness layered on each side of the layered prepregs, and were then heated and pressed at 170° C. for 90 minutes at a pressure of 3 MPa, to obtain a double-sided copper clad laminate.

In the obtained laminate, the thickness per fiber base material was 42 μm. The surface roughness of the laminate was measured to be 5.7 μm in maximum roughness (Rmax), 4.3 μm in mean roughness (Rtm) and 4.2 μm in maximum wave crest (WCM).

COMPARATIVE EXAMPLE 2

A varnish was prepared by dissolving 100 parts by weight of a brominated bisphenol A epoxy resin (trade name:

EPIKOTE E5048, produced by Yuka Shell Epoxy Co., Ltd.), 15 parts by weight of a phenol novolac resin (trade name: BARCAM TD-2131, produced by Dainippon Ink & Chemicals, Inc.) and 0.15 parts by weight of phenylimidazole in a solvent mixture of ethylene glycol monomethyl ether/methyl ethyl ketone (weight ratio: 1/100). Glass nonwoven fabric of a basis weight of 25 g/m² was impregnated with the varnish, and was then dried to obtain prepregs. Eight sheets of the prepregs were put in layers with a copper foil of 18 μm in thickness layered on each side of the layered prepregs, and were then heated and pressed at 170° C. for 90 minutes at a pressure of 3 MPa, to obtain a double-sided copper clad laminate.

In the obtained laminate, the thickness per fiber base material was 49 μm. The surface roughness of the laminate was measured to be 3.5 μm in maximum roughness (Rmax), 2.3 μm in mean roughness (Rtm) and 3.7 μm in maximum wave crest (WCM).

The copper clad laminates were tested for resistance to copper migration and soldering heat resistance. The results are listed in Table 1.

The test of resistance to copper migration was performed by etching each copper-clad laminate to form a comb pattern for migration test with a conductor width of 150 μm and a distance between conductors of 100 μm, continuously applying the conductor pattern with 50 V for a period as listed in Table 1 at 85° C. and at 85%RH, and then observing the tested laminate. The test of soldering heat resistance was performed by subjecting four copper-clad laminates to each of the treatments listed in Table 1, dipping the treated laminates for 20 seconds in a solder bath heated to 260° C., and then observing the laminates. As to the soldering heat resistance, the symbols listed in Table 1 have the following meanings;

O: no changes

Δ: measling

X: blistering

TABLE 1

|  | Example | Comparative examples | |
| --- | --- | --- | --- |
|  | 1 | 1 | 2 |
| Resistance to migration | No abnormality was observed for 1500 hours. | Migration occurred in 780 hours. | Migration occurred in 1260 hours. |
| Soldering heat resistance |  |  |  |
| A (normal state) | O O O O | O O O O | O O O O |
| PCT-1.5 hours | O O Δ Δ | O O Δ x | O O Δ Δ |
| D-6/100 | O O O O | O O Δ Δ | O O O Δ |
| C-192/40/90 | O O O O | O Δ Δ Δ | O O O Δ |

Evaluation of drilling processability was then performed. The double-sided copper-clad laminates obtained in Example 1 and Comparative Examples 1 and 2 were drilled with a drill of 0.4 mm in diameter and were then copper plated. As an index of the hole wall roughness, the maximum length (unit: μm) of the permeated copper in each hole of the drilling cycles as shown in Table 2 was measured, and the average of the ten holes of each drilling cycle was calculated. The results are listed in Table 2.

TABLE 2

|  | Example | Comparative example | |
| --- | --- | --- | --- |
| Drilling cycle | 1 | 1 | 2 |
| 1–10 holes | 12.7 | 21.5 | 13.8 |
| 5001–5010 holes | 24.3 | 42.3 | 29.0 |
| 9991–10000 holes | 45.8 | 79.8 | 67.3 |

By the method of the present invention, it is possible to produce metal clad laminates which are equal or excel in properties to laminates produced by using conventional glass fabrics, and are less in thickness and better in surface evenness than conventional laminates. Further, the metal clad laminates produced by the method of the present invention are almost free from migration, which might occur more frequently in printed wiring boards produced by using conventional laminates, as the density of the printed wiring boards increases. The metal clad laminates produced by the method of the present invention are also superior in drilling processability to the laminates using the conventional glass fabrics, and have so improved hole wall surfaces as to improve the insulation reliability between through holes in printed wiring boards.

What is claimed is:

1. A method of producing a metal clad laminate comprising bonding at least two layers of resin sheets and a metal foil layered on at least one side of the layered resin sheets with heat and pressure, each of the resin sheets comprising inorganic fibers, solid particles of a thermosetting resin and a completely cured binder resin bonding the inorganic fibers and the solid particles of the thermosetting resin together, the binder resin having been completely cured prior to said bonding the at least two layers of resin sheets, only the solid particles of the thermosetting resin bonding the two layers of resin sheets and the metal foil, wherein the inorganic fibers and the solid particles of the thermosetting resin are in a weight ratio of (inorganic fibers):(solid particles of thermosetting resin) of 50:50 to 10:90, and the completely cured binder resin is 1 to 20% by weight of a total of the inorganic fibers and the solid particles of the thermosetting resin.

2. The method claim 1, wherein the thermosetting resin is selected from the group consisting of an epoxy resin, a thermosetting polyimide resin and a cyanate resin, and the completely cured binder resin, which has been completely cured prior to said bonding the at least two layers of resin sheets, is selected from the group consisting of a cured acrylic resin, a cured phenol-poly(vinylacetal) resin, a cured phenolic nitrile rubber, a phenolic chloroprene resin and a cured silicone resin.

3. The method of claim 1, wherein each of the resin sheets is produced by removing water from a slurry comprising the inorganic fibers, the solid particles of the thermosetting resin and the water to form a sheet comprising the inorganic fibers and the solid particles of the thermosetting resin, coating the sheet with a curable binder resin, and then heating the sheet to dry and the curable binder resin but not to cure the solid particles of the thermosetting resin.

4. The method of claim 3, wherein the thermosetting resin forming the solid particles is selected from the group consisting of an epoxy resin, a thermosetting polyimide resin and a cyanate resin, and the curable binder resin is selected from the group consisting of a thermosetting acrylic resin, a phenolic resin/poly(vinylacetal) resin adhesive, a phenolic resin/nitrile rubber adhesive, a phenolic resin/chloroprene resin adhesive and a thermosetting silicone resin, the heating of the sheets obtained by the removal of water from the slurry and the coating of the curable resin, is carried out at 100° to 180° C. for 5 to 300 seconds, and the bonding of the layered resin sheets and the metal foil is carried out at 160° to 200° C. for 60 to 180 minutes with a pressure of 0.5 to 15 MPa.

5. The method of claim 4, wherein the inorganic fibers are glass fibers of 1 to 20 μm in diameter, solid particles of the thermosetting resin are 0.001 to 100 μm in particle size, the thermosetting resin forming the solid particles is an epoxy resin comprising brominated bisphenol A epoxy resin and, as a curing agent, a phenolic novolac resin, and the curable binder resin is a thermosetting acrylic resin comprising a copolymer of butyl acrylate, acrylonitrile and β-hydroxyethyl methacrylate and, as a curing agent, trimethylpropane-1-methyl-2-isocyano-4-carbamate.

6. The method of claim 3, wherein the curable binder resin has a gel time of 5–300 seconds at 130° C.

7. The method of claim 1, wherein the solid particles of the thermosetting resin are softened and cured during said bonding with heat and pressure.

8. The method of claim 1, wherein, prior to said bonding with heat and pressure, the solid particles of the thermosetting resin are not cured.

9. The method of claim 1, wherein the solid particles of the thermosetting resin are particles that maintain a solid state until said bonding of the at least two layers of resin sheets with heat and pressure.

10. The method of claim 1, wherein the solid particles of the thermosetting resin have a gel time of more than 5 minutes at 130° C.

11. The method of claim 1, wherein the binder resin that is completely cure fixes the inorganic fibers and the solid particles of the thermosetting resin.

* * * * *